United States Patent
Kim et al.

(10) Patent No.: US 10,431,742 B2
(45) Date of Patent: Oct. 1, 2019

(54) ORGANIC LIGHT-EMITTING DISPLAY APPARATUS AND METHOD OF MANUFACTURING THE SAME

(71) Applicant: Samsung Display Co., Ltd., Yongin-si (KR)

(72) Inventors: Arong Kim, Yongin-si (KR); Jungsun Park, Yongin-si (KR); Hyunsung Bang, Yongin-si (KR); Duckjung Lee, Yongin-si (KR); Jiyoung Choung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/860,466

(22) Filed: Jan. 2, 2018

(65) Prior Publication Data

US 2018/0190907 A1    Jul. 5, 2018

(30) Foreign Application Priority Data

Jan. 3, 2017    (KR) .......................... 10-2017-0000791

(51) Int. Cl.
*H01L 51/00*    (2006.01)
*G03F 7/09*    (2006.01)
(Continued)

(52) U.S. Cl.
CPC .......... *H01L 51/0016* (2013.01); *G03F 7/094* (2013.01); *G03F 7/095* (2013.01);
(Continued)

(58) Field of Classification Search
CPC .................. H01L 51/0016; H01L 27/3211
See application file for complete search history.

(56) References Cited

U.S. PATENT DOCUMENTS

| | | | | |
|---|---|---|---|---|
| 4,519,872 A | * | 5/1985 | Anderson, Jr. | ......... G03F 7/039 204/192.32 |
| 4,826,564 A | * | 5/1989 | Desilets | ................. G03F 7/094 216/47 |

(Continued)

FOREIGN PATENT DOCUMENTS

| JP | 2002-170669 | 6/2002 |
|---|---|---|
| JP | 2007-528511 | 10/2007 |

(Continued)

*Primary Examiner* — Moazzam Hossain
*Assistant Examiner* — Farun Lu
(74) *Attorney, Agent, or Firm* — H.C. Park & Associates, PLC

(57) ABSTRACT

A method of manufacturing an organic light-emitting display apparatus including forming a lift-off layer on a substrate including a first electrode, the lift-off layer including a fluoropolymer; sequentially forming a barrier layer and a photoresist on the lift-off layer, the barrier layer including an inorganic material; patterning the photoresist and the barrier layer to remove a first portion of the photoresist corresponding to the first electrode such that a second portion other than the first portion remains; etching a portion of the lift-off layer corresponding to the first portion to expose the first electrode; forming an organic functional layer and an auxiliary electrode over the first electrode and the second portion of the photoresist, the organic functional layer including an emission layer; and removing the lift-off layer, the barrier layer, the photoresist, the organic functional layer, and the auxiliary electrode remaining on the second portion.

10 Claims, 22 Drawing Sheets

(51) Int. Cl.
    *G03F 7/095*       (2006.01)
    *G03F 7/16*         (2006.01)
    *G03F 7/20*         (2006.01)
    *G03F 7/26*         (2006.01)
    *H01L 51/56*       (2006.01)
    *H01L 27/32*       (2006.01)
    *H01L 51/52*       (2006.01)
    *H01L 51/50*       (2006.01)

(52) U.S. Cl.
    CPC ................ *G03F 7/16* (2013.01); *G03F 7/20* (2013.01); *G03F 7/2022* (2013.01); *G03F 7/26* (2013.01); *H01L 51/56* (2013.01); *H01L 27/3211* (2013.01); *H01L 27/3246* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5228* (2013.01)

(56) References Cited

U.S. PATENT DOCUMENTS

| | | |
|---|---|---|
| 2005/0202351 A1 | 9/2005 | Houlihan et al. |
| 2006/0035015 A1 | 2/2006 | Raychaudhuri et al. |
| 2008/0166667 A1 | 7/2008 | Goldfarb |
| 2017/0256754 A1* | 9/2017 | Defranco ................ H01L 51/56 |

FOREIGN PATENT DOCUMENTS

| | | |
|---|---|---|
| JP | 2008-085200 | 4/2008 |
| WO | 2008/038588 | 4/2008 |

\* cited by examiner

ORGANIC LIGHT-EMITTING DISPLAY APPARATUS AND METHOD OF MANUFACTURING THE SAME

CROSS-REFERENCE TO RELATED APPLICATION

This application claims priority from and the benefit of Korean Patent Application No. 10-2017-0000791, filed on Jan. 3, 2017, which is hereby incorporated by reference for all purposes as if fully set forth herein.

BACKGROUND

Field

Exemplary embodiments of the invention relate generally to an organic light-emitting display apparatus and a method of manufacturing the same.

Description of the Related Art

Organic light-emitting display apparatuses include a hole injection electrode, an electron injection electrode, and an organic emission layer formed between the hole injection electrode and the electron injection electrode, and are self-emissive display apparatuses that emit light when holes injected from the hole injection electrode and electrons injected from the electron injection electrode recombine and are eliminated in the organic emission layer. Organic light-emitting display apparatuses are widely-known as next-generation display apparatuses because of high quality characteristics such as low power consumption, a high luminance, and a fast response time.

The above information disclosed in this Background section is only for understanding of the background of the inventive concepts, and, therefore, it may contain information that does not constitute prior art.

SUMMARY

Exemplary embodiments of the inventive concepts provide an organic light-emitting display apparatus that may increase resolution and may reduce the number of defects, and a method of manufacturing the organic light-emitting display apparatus.

Additional aspects will be set forth in part in the description which follows and, in part, will be apparent from the description, or may be learned by practice of the presented embodiments.

An exemplary embodiment of the inventive concepts discloses: a method of manufacturing an organic light emitting display apparatus including forming a lift-off layer on a substrate including a first electrode, the lift-off layer including a fluoropolymer; sequentially forming a barrier layer and a photoresist on the lift-off layer, the barrier layer including an inorganic material; patterning the photoresist and the barrier layer to remove a first portion of the photoresist corresponding to the first electrode such that a second portion other than the first portion remains; etching a portion of the lift-off layer corresponding to the first portion to expose the first electrode; forming an organic functional layer and an auxiliary electrode over the first electrode and the second portion of the photoresist, the organic functional layer including an emission layer; and removing the lift-off layer, the barrier layer, the photoresist, the organic functional layer, and the auxiliary electrode remaining on the second portion.

A fluorine content of the lift-off layer may be in a range of about 20 wt % to about 60 wt %.

The barrier layer may include at least one of a metal, metal oxide, metal nitride, metal oxynitride, and an alloy.

The barrier layer may include at least one of silicon nitride, silicon oxide, and silicon oxynitride.

The organic functional layer may further include at least one functional layer from among a hole injection layer, a hole transport layer, an electron transport layer, and an electron injection layer.

The organic functional layer may be formed by using a deposition process.

The patterning of the photoresist and the barrier layer may include removing parts of the photoresist and the barrier layer by using a photolithography process.

The etching of the portion of the lift-off layer corresponding to the first portion may include etching the portion of the lift-off layer corresponding to the first portion by using a first solvent comprising fluorine to expose the first electrode.

The method may further include performing plasma treatment on the exposed first electrode.

The removing of the lift-off layer, the barrier layer, the photoresist, the organic functional layer, and the auxiliary electrode remaining on the second portion may include lifting off the lift-off layer remaining on the second portion by using a second solvent including fluorine to remove the barrier layer, the photoresist, the organic functional layer, and the auxiliary electrode along with the lift-off layer.

The method may further include forming a pixel-defining film that surrounds an edge of the first electrode.

Another exemplary embodiment of the inventive concepts discloses a method of manufacturing an organic light emitting display apparatus including: forming a plurality of first electrodes on a substrate and performing a first unit process including the steps of: (a1) forming a first lift-off layer on the substrate including the plurality of first electrodes, the first lift-off layer including a fluoropolymer; (b1) sequentially forming a first photoresist on the first lift-off layer; (c1) patterning the first photoresist to remove a first portion of the first photoresist corresponding to the first electrodes of a first group such that a second portion other than the first portion remains; (d1) etching a portion of the first lift-off layer corresponding to the first portion to expose the first electrodes of the first group; (e1) sequentially forming a first organic functional layer and a first auxiliary electrode over the first electrodes of the first group and the second portion of the first photoresist, the first organic functional layer including a first emission layer; and (f1) removing the first lift-off layer, the first photoresist, the first organic functional layer, and the first auxiliary electrode remaining on the second portion; and after the performing of the first unit process, performing, at least once, a second unit process including the steps of: (a2) forming a second lift-off layer on a resultant structure of step (f1), the second lift-off layer including a fluoropolymer; (b2) forming a barrier layer and a second photoresist on the second lift-off layer, the barrier layer including an inorganic material; (c2) patterning the second photoresist and the barrier layer to remove a first portion of the second photoresist corresponding to the first electrodes of a second group such that a second portion other than the first portion remains; (d2) etching a portion of the second lift-off layer corresponding to the first portion to expose the first electrodes of the second group; (e2) sequentially forming a second organic functional layer and a second auxiliary electrode over the first electrodes of the second group and the second portion of the second photoresist, the second organic functional layer including a second emission layer; and (f2) removing the second lift-off layer, the barrier layer, the second photoresist, the second organic functional layer, and the second auxiliary electrode remaining on the second portion. After the first and second unit processes are performed, a second electrode is formed.

Colors of light emitted by the first emission layer and the second emission layer may be different from each other.

The etching of the portion of the first lift-off layer in step (d1) and the etching of the portion of the second lift-off layer in step (d2) may be performed by using wet etching using a first solvent comprising fluorine In steps (d1) and (d2), after the wet etching using the first solvent, plasma treatment may be performed on the exposed first electrodes of the first group and the exposed second electrode of the second group.

The barrier layer may include at least one of a metal, metal oxide, metal nitride, metal oxynitride, and an alloy.

The barrier layer may include at least one of silicon nitride, silicon oxide, and silicon oxynitride.

The removing of the first lift-off layer, the first photoresist, the first organic functional layer, and the first auxiliary electrode in step (f1) and the removing of the second lift-off layer, the barrier layer, the second photoresist, the second organic functional layer, and the second auxiliary electrode in step (f2) may be performed by using a second solvent including fluorine.

The second electrode may be commonly formed on the first auxiliary electrode and the second auxiliary electrode.

According to one or more exemplary embodiments, there is provided an organic light-emitting display apparatus manufactured by using the method.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE ILLUSTRATED EMBODIMENTS

Figure 1:
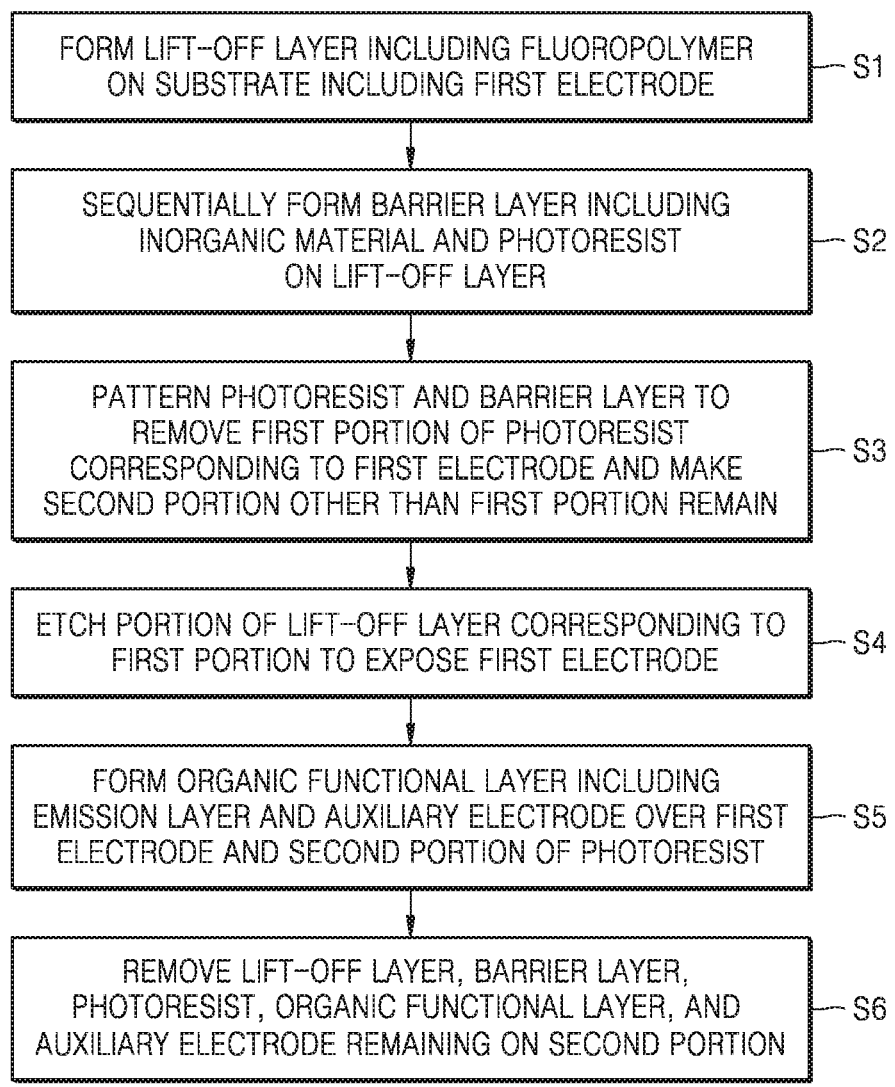
FIG. 1 is a flowchart of a manufacturing method according to an exemplary embodiment.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

FIG. 1 is a flowchart of a manufacturing method according to an exemplary embodiment.

Referring to FIG. 1, a method of manufacturing an organic light-emitting display apparatus includes operation S1 in which a lift-off layer including a fluoropolymer is formed on a substrate including a first electrode, operation S2 in which a barrier layer including an inorganic material and a photoresist are sequentially formed on the lift-off layer, operation S3 in which the photoresist and the barrier layer are patterned to remove a first portion of the photoresist corresponding to the first electrode such that a second portion other than the first portion remains, operation S4 in which a portion of the lift-off layer corresponding to the first portion is etched to expose the first electrode, operation S5 in which an organic functional layer including an emission layer and an auxiliary electrode are formed over the first electrode and the second portion of the photoresist, and operation S6 in which the lift-off layer, the barrier layer, the photoresist, the organic functional layer, and the auxiliary electrode remaining on the second portion are removed.

A method of manufacturing an organic light-emitting display apparatus according to an exemplary embodiment and an organic light-emitting display apparatus 1 manufactured by using the manufacturing method will now be explained in detail with reference to FIGS. 2 through 7E.

Figure 2:
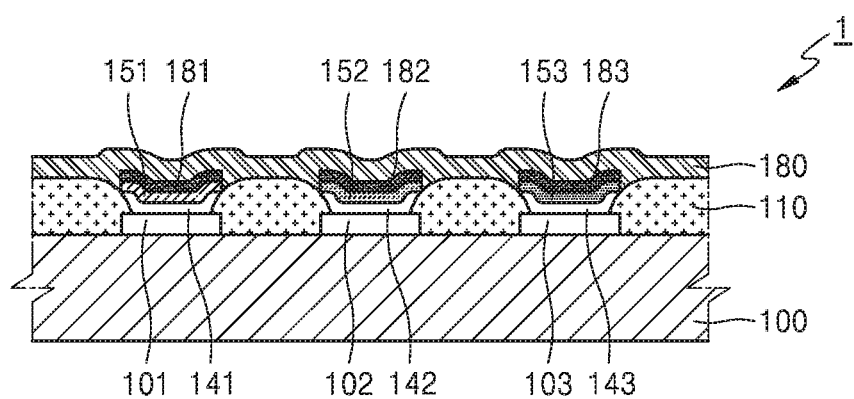
FIG. 2 is a cross-sectional view of an organic light-emitting display apparatus manufactured by using the manufacturing method of FIG. 1.
Figure 3:
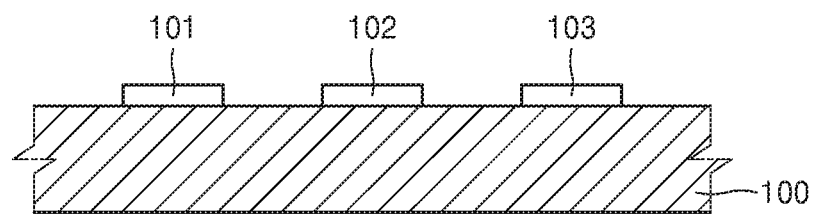
FIG. 3 is a cross-sectional view for explaining an operation of forming a plurality of anodes on a substrate in the manufacturing method of FIG. 1.
Figure 4:
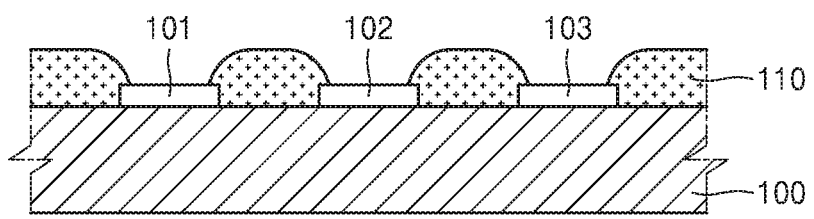
FIG. 4 is a cross-sectional view for explaining an operation of forming a pixel-defining film on edges of the anodes of FIG. 3.

FIG. 2 is a cross-sectional view of the organic light-emitting display apparatus 1 manufactured by using the manufacturing method according to the exemplary embodiment of FIG. 1. FIG. 3 is a cross-sectional view for explaining an operation of forming a plurality of anodes on a substrate by using the manufacturing method according to the exemplary embodiment of FIG. 1. FIG. 4 is a cross-sectional view for explaining an operation of forming a pixel-defining film on edges of the anodes. FIGS. 5A through 5E are cross-sectional views for explaining a first unit process of the manufacturing method according to the exemplary embodiment of FIG. 1. FIGS. 6A through 6E are cross-sectional views for explaining a second unit process of the manufacturing method according to the exemplary embodiment of FIG. 1. FIGS. 7A through 7E are cross-sectional views for explaining a third unit process of the manufacturing method according to the exemplary embodiment of FIG. 1.

Referring to FIG. 2, in the organic light-emitting display apparatus 1 manufactured by using the manufacturing method according to the exemplary embodiment of FIG. 1, a plurality of anodes including a first anode 101, a second anode 102, and a third anode 103 are located apart from one another on a substrate 100. A pixel-defining film 110 covers edges of the first through third anodes 101, 102, and 103. First through third organic functional layers 151, 152, and 153, each including an emission layer, are respectively located on the first through third anodes 101, 102, and 103. First through third auxiliary cathodes 181, 182, and 183 are respectively located on the first through third organic functional layers 151, 152, and 153. A cathode 180 is formed as a common layer on the first through third auxiliary cathodes 181, 182, and 183.

Referring to FIG. 3, the plurality of anodes including the first anode 101, the second anode 102, and the third anode 103 are formed on the substrate 100.

The substrate 100 may be formed by using any of various materials. For example, the substrate 100 may be formed by using glass or plastic. The plastic may be formed of a material having high heat resistance and high durability such as polyimide, polyethylene naphthalate, polyethylene terephthalate, polyarylate, polycarbonate, polyetherimide, or polyethersulfone.

Although not shown in FIG. 3, a buffer layer (not shown) for planarizing the substrate 100 and preventing penetration of impurity elements into the substrate 100 may be further formed on the substrate 100. The buffer layer may have a single or multi-layer structure formed of silicon nitride and/or silicon oxide.

Each of the first through third anodes 101, 102, and 103 that are hole injection electrodes may be formed of a material having a large work function. Each of the first through third anodes 101, 102, and 103 may include at least one selected from the group consisting of indium tin oxide, indium zinc oxide, zinc oxide, indium oxide, indium gallium oxide, and aluminum zinc oxide. Also, each of the first through third anodes 101, 102, and 103 may have a single or multi-layer structure formed of silver (Ag), aluminum, magnesium, lithium, or calcium.

Although not shown in FIG. 3, the first through third anodes 101, 102, and 103 may be electrically connected to first through third thin-film transistors (TFTs, not shown) between the substrate 100 and the first through third anodes 101, 102, and 103.

Referring to FIG. 4, the pixel-defining film 110 that surrounds edges of the first anode 101, the second anode 102, and the third anode 103 is formed on the substrate 100.

Since end portions of the first through third anodes 101, 102, and 103 are sharp, when current is applied after the cathode 180 is formed, an electric field may concentrate on the end portions of the first through third anodes 101, 102, and 103, and an electrical short-circuit may occur during operation. However, in the present exemplary embodiment, since the end portions of the first through third anodes 101, 102, and 103 are covered by the pixel-defining film 110, an electric field may be prevented from concentrating on the end portions of the first through third anodes 101, 102, and 103.

The pixel-defining film 110 may be an organic insulating film including, for example, a general-purpose polymer (e.g., poly(methyl methacrylate) (PMMA) or polystyrene (PS)), a polymer derivative containing a phenol group, an acryl-based polymer, an imide-based polymer, an arylether-based polymer, an amide-based polymer, a fluorine-based polymer, a p-xylene-based polymer, a vinylalcohol-based polymer, or a blend thereof.

Figure 5A:
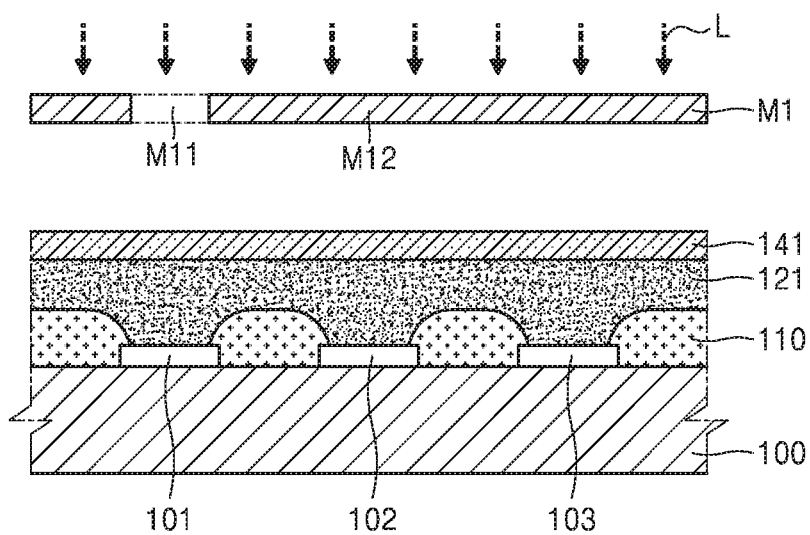
FIG. 5A, FIG. 5B, FIG. 5C, FIG. 5D, and FIG. 5E are cross-sectional views for explaining a first unit process of the manufacturing method of FIG. 1.

Referring to FIG. 5A, a first lift-off layer 121 including a fluoropolymer and a first photoresist 141 are sequentially formed on the substrate 100 on which the first through third anodes 101, 102, and 103 are formed.

The fluoropolymer included in the first lift-off layer 121 may be a polymer having a fluorine content in a range of about 20 wt % to about 60 wt %. For example, the fluoropolymer included in the first lift-off layer 121 may include at least one from among polytetrafluoroethylene, polychlorotrifluoroethylene, polydichlorodifluoroethylene, a copolymer of chlorotrifluoroethylene and dichlorodeflueoroethylene, a copolymer of tetrafluoroethylene and perfluoroalkylvinylether, a copolymer of chlorotrifluoroethylene and perfluoroalkylvinylether, a copolymer of tetrafluoroethylene and perfluoroalkylvinylether, and a copolymer of chlorotrifluoroethylene and perfluoroalkylvinylether.

The first lift-off layer 121 may be formed on the substrate 100 by using a method such as coating, printing, or deposition. When the first lift-off layer 121 is formed by using coating and printing, polymerization may be performed and then a process of forming the first photoresist 141 may be performed, if necessary.

A thickness of the first lift-off layer 121 may be equal to or greater than 0.2 μm and equal to or less than 5 μm. When a thickness of the first lift-off layer 121 is too large, a time taken to melt the first lift-off layer 121 for patterning may be increased and a manufacturing process time may be increased. When a thickness of the first lift-off layer 121 is too small, it is difficult to lift off the first lift-off layer 121.

The first photoresist 141 is formed on the first lift-off layer 121. A portion of the first photoresist 141 corresponding to the first anode 101 is exposed through a first photomask M1 including a region M11 through which light L is transmitted. Next, the exposed first photoresist 141 is developed.

Figure 5B:
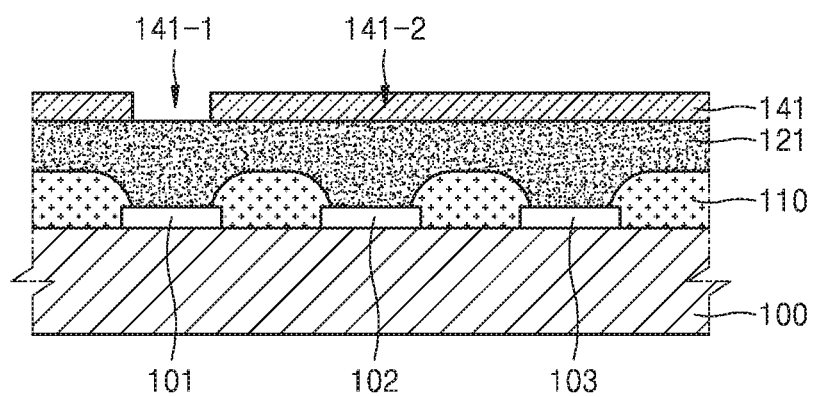

Referring to FIG. 5B, the first photoresist 141 is patterned. A first portion 141-1 of the first photoresist 141 corresponding to the first anode 101 and subjected to exposure and development is removed and a second portion 141-2 other than the first portion 141-1 remains.

Figure 5C:
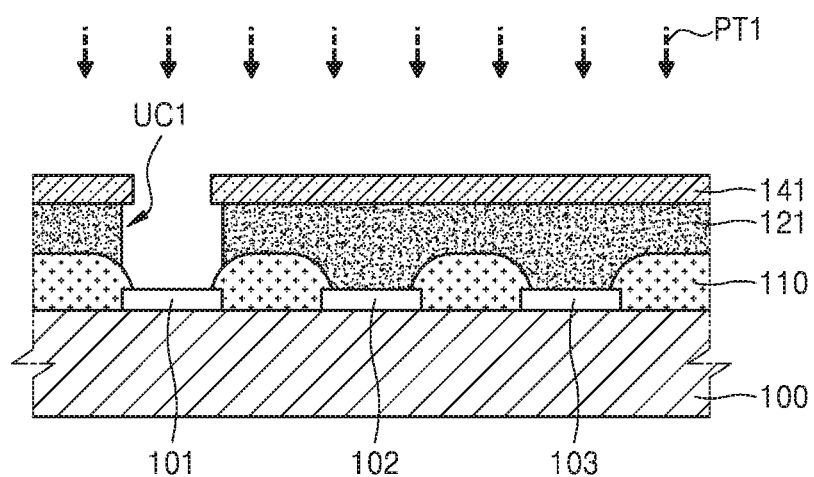

Referring to FIG. 5C, the first lift-off layer 121 is etched by using a pattern of the first photoresist 141 of FIG. 5B as an etch mask.

Since the first lift-off layer 121 includes the fluoropolymer, a solvent capable of etching the fluoropolymer is used as an etching solution.

A first solvent (not shown) including fluorine may be used as an etching solution. The first solvent may include hydrofluoroether. Hydrofluoroether is electrochemically stable because of its low interaction with other materials and environmentally stable because of its low global warming potential and low toxicity.

When the first lift-off layer 121 is etched, a first undercut profile UC1 is formed in the first lift-off layer 121 under a boundary surface of the first portion 141-1 of the first photoresist 141 due to the first solvent including the fluorine. A delicate deposition pattern of the first organic functional layer 151 may be formed in a subsequent deposition process due to the first undercut profile UC1.

During an etching process, a portion of the first lift-off layer 121 corresponding to the first portion 141-1, that is, formed over the first anode 101, is etched, and thus an upper portion of the first anode 101 is exposed. After the etching process, the exposed first anode 101 is subjected to first plasma treatment PT1. A residue of the first lift-off layer 121 that may remain on the first anode 101 may be removed during the first plasma treatment PT1.

Figure 5D:
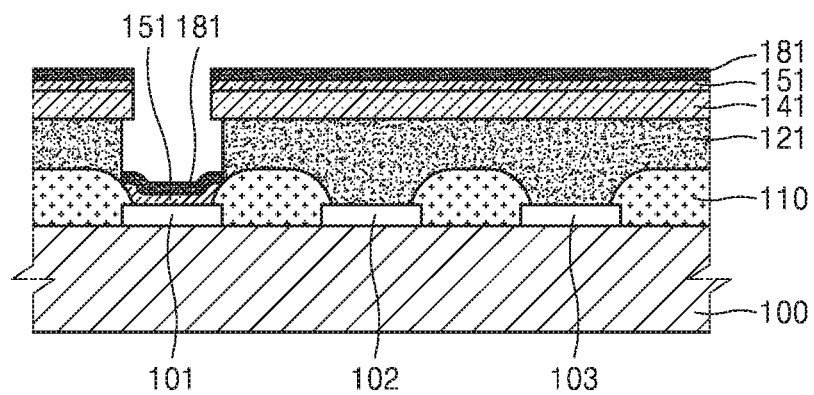

Referring to FIG. 5D, the first organic functional layer 151 including a first emission layer (not shown) and the first auxiliary cathode 181 are sequentially formed on a structure of FIG. 5C.

The first organic functional layer 151 may further include at least one functional layer from among a hole injection layer, a hole transport layer, an electron transport layer, and an electron injection layer.

The first organic functional layer 151 may be formed by using vapor deposition. In a deposition process, the first lift-off layer 121 and the first photoresist 141 function as a deposition mask. A part of the first organic functional layer 151 is formed at a position corresponding to the first portion 141-1, that is, over the first anode 101, and another part of the first organic functional layer 151 is formed on the second portion 141-2 of the first photoresist 141.

The first auxiliary cathode 141 may be formed by using vacuum deposition, like the first organic functional layer 151. In a deposition process, the first lift-off layer 121 and the first photoresist 141 function as a deposition mask. A part of the first auxiliary cathode 181 is formed to cover a top surface of the first organic functional layer 151. Another part of the first auxiliary cathode 181 is formed on the first organic functional layer 151 to correspond to the second portion 141-2 other than the first portion 141-1 of the first photoresist 141.

The first auxiliary cathode 181 may include a material that is the same as that of the cathode 180 that is a common electrode. Alternatively, the first auxiliary cathode 181 may be formed of a material that is different from that of the cathode 180. The first auxiliary cathode 181 may function as a barrier for protecting the first organic functional layer 151 from a solvent used in a lift-off process.

Figure 5E:
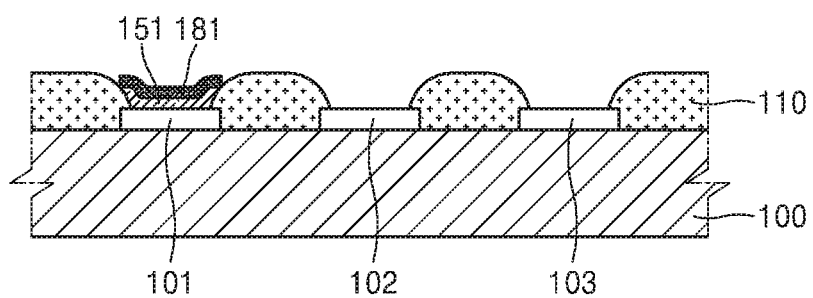

Referring to FIG. 5E, a lift-off process is performed on a structure of FIG. 5D.

Since the first lift-off layer 121 includes the fluoropolymer, a second solvent including fluorine is used in the lift-off process. Since the first organic functional layer 151 is formed and then the lift-off process is performed, the second solvent should have a low reactivity to the first organic functional layer 151. The second solvent may include hydrofluoroether, like the first solvent.

The first lift-off layer 121 formed under the second portion 141-2 (see FIG. 5B) of the first photoresist 141 is lifted off, the first organic functional layer 151 and the first auxiliary cathode 181 formed on the second portion 141-2 (see FIG. 5B) of the first photoresist 141 are removed, and the first organic functional layer 151 and the first auxiliary cathode 181 formed on the first anode 101 remain as a pattern.

After the above-described first unit process is performed, a second unit process of forming the second organic functional layer 152 (see FIG. 6D) that emits color light different from that of the first organic functional layer 151 in an area where the second anode 101 is located is performed. The second unit process will now be explained with reference to FIGS. 6A through 6E.

Figure 6A:
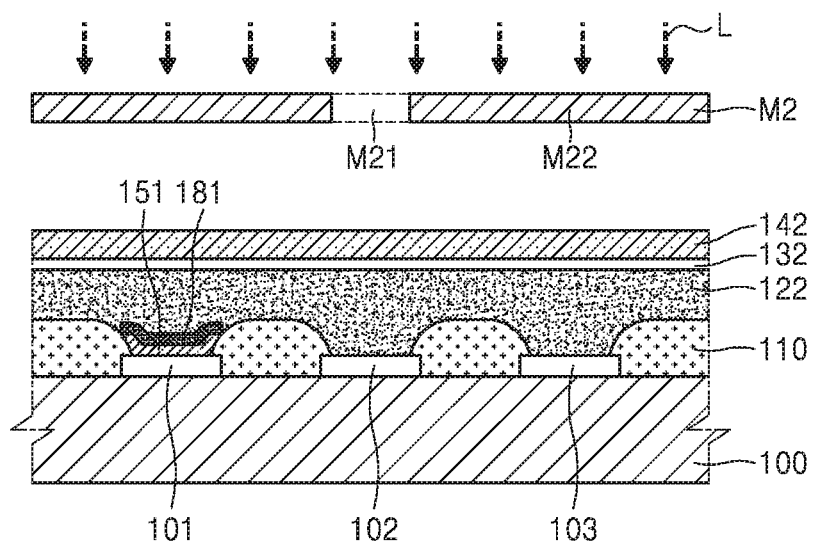
FIG. 6A, FIG. 6B, FIG. 6C, FIG. 6D, and FIG. 6E are cross-sectional views for explaining a second unit process of the manufacturing method of FIG. 1

Referring to FIG. 6A, a second lift-off layer 122 including a fluoropolymer, a second barrier layer 132, and a second photoresist 142 are sequentially formed on a structure of FIG. 5E.

The fluoropolymer included in the second lift-off layer 122 may be a polymer having a fluorine content in a range of about 20 wt % to about 60 wt %. The second lift-off layer 122 may include a material that is the same as or different from that of the first lift-off layer 121. The second lift-off layer 122 may be formed by using coating, printing, or deposition.

The second barrier layer 132 is formed on the second lift-off layer 122. The second barrier layer 132 may prevent impurities from diffusing from the second photoresist 122 to the second lift-off layer 122. The second barrier layer 132 may include at least one from among a metal, metal oxide, metal nitride, metal oxynitride, and an alloy.

The second photoresist 142 is formed on the second barrier layer 132. A portion of the second photoresist 142 corresponding to the second anode 102 is exposed through a second photomask M2 including a region M21 through which light L is transmitted. Next, the exposed second photoresist 142 is developed.

Figure 6B:
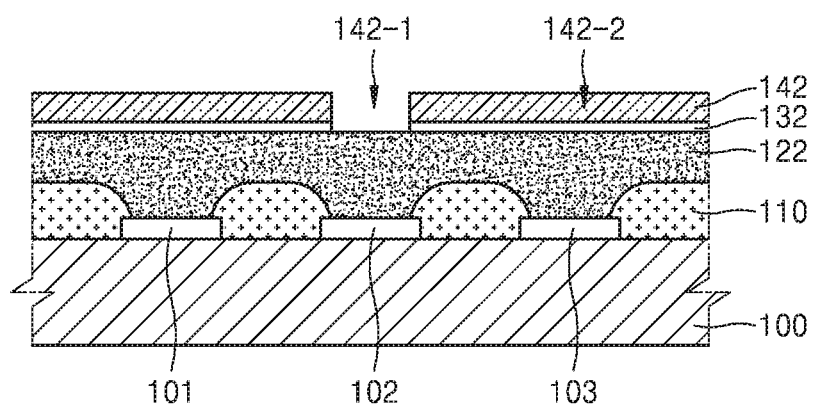

Referring to FIG. 6B, the second photoresist 142 is patterned. A first portion 142-1 of the second photoresist 142 corresponding to the second anode 102 and subjected to exposure and development is removed and a second portion 142-2 other than the first portion 142-1 remains.

The second barrier layer 132 is patterned along with the second photoresist 142. The second barrier layer 132 is patterned by etching the second barrier layer 132 including an inorganic material by using a solution for developing the second photoresist 142. Since the second barrier layer 132 is etched by using a developing solution of the second photoresist 142, the process may be simplified.

Propylene glycol methyl ether acetate (PGMEA) that is used as a solvent of the second photoresist 142 may diffuse to the second lift-off layer 122 and may degrade the first organic functional layer 151 that is formed in the first unit process. Oxygen or moisture, as well as PGMEA, may also diffuse to the second lift-off layer 122 and may degrade the first organic functional layer 151 that is formed in the first unit process.

However, in the present exemplary embodiment, since the second barrier layer 132 is formed between the second lift-off layer 122 and the second photoresist 142, PGMEA, moisture, and oxygen may be prevented from diffusing to the second lift-off layer 122 while the second photoresist 142 is developed. Accordingly, degradation of the first organic functional layer 151 may be reduced or prevented.

A thickness of the second barrier layer 132 may be equal to or greater than 200 Å and equal to or less than 1000 Å. When a thickness of the second barrier layer 132 is less than 200 Å, the second barrier layer 132 may not efficiently function as a barrier film due to a high water vapor transmission rate, and when a thickness of the second barrier layer 132 is greater than 1000 Å, it is difficult to etch the second barrier layer 132 while the second photoresist 142 is developed.

Figure 11:
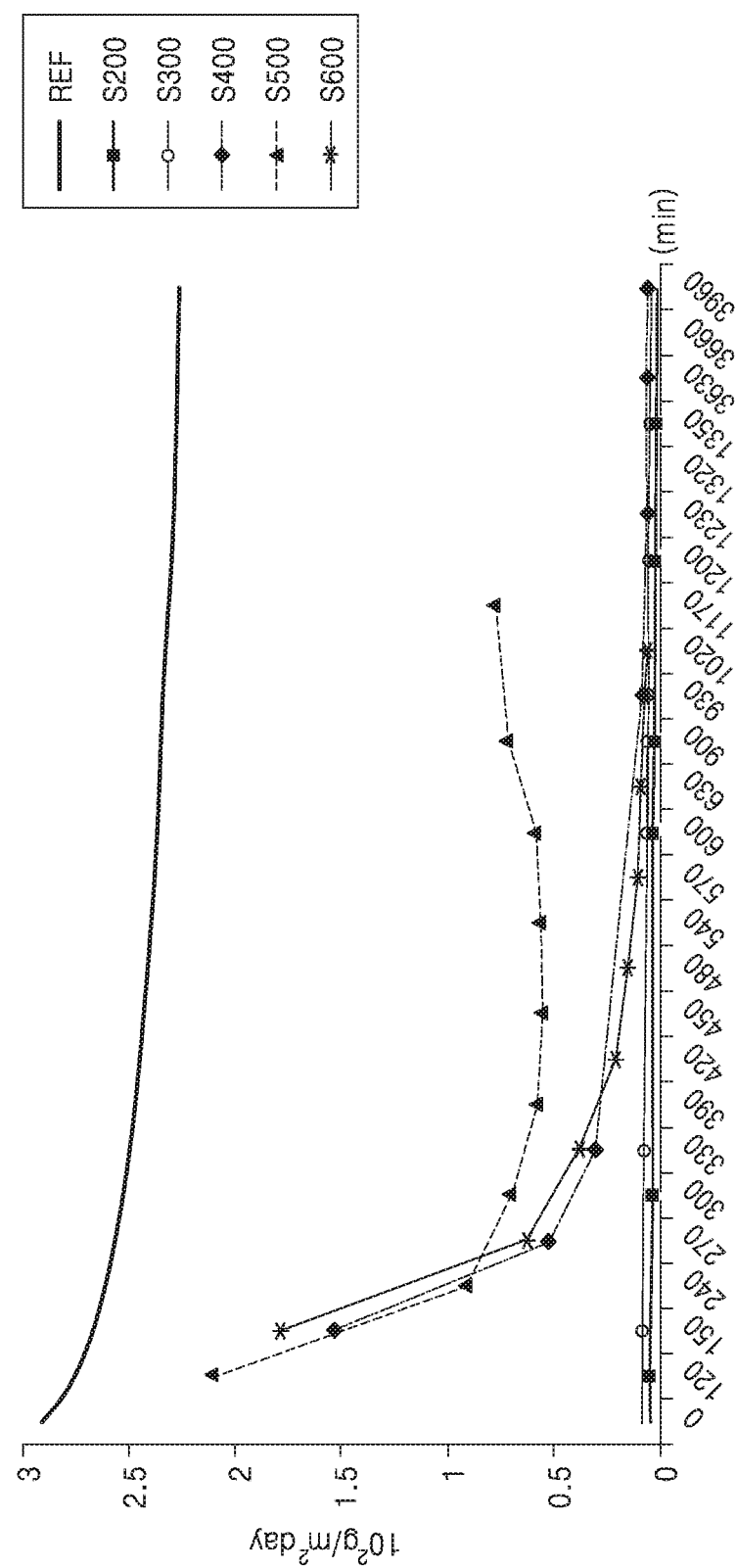
FIG. 11 is a graph showing a relationship between a water vapor transmission rate and a time when a thickness of a second barrier layer is changed.

FIG. 11 is a graph illustrating a relationship between a water vapor transmission rate (WVTR) and a time when a thickness of the second barrier layer 132 is changed. FIG. 11 is a graph illustrating a relationship between a WVTR and a time when the second barrier layer 132 was formed of aluminum on the second lift-off layer 122 to some thicknesses.

It is found that a WVTR of each of a sample 5200 in which a thickness of the second barrier layer 132 was 200 Å, a sample 5300 in which a thickness of the second barrier layer 132 was 300 Å, a sample 5400 in which a thickness of the second barrier layer 132 was 400 Å, a sample S500 in which a thickness of the second barrier layer 132 was 500 Å, and a sample S1000 in which a thickness of the second barrier layer 132 was 1000 Å is much lower than that of a reference sample REF having no second barrier layer.

Figure 6C:
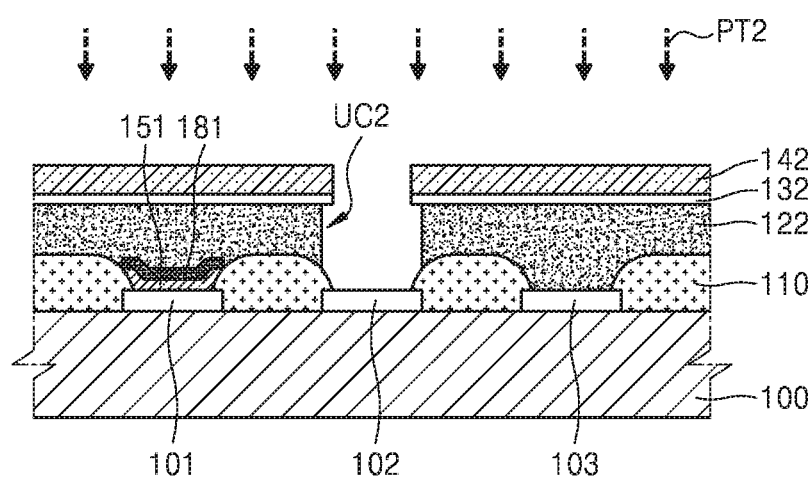

Referring to FIG. 6C, the second lift-off layer 122 is etched by using a pattern of the second barrier layer 132 and the second photoresist 142 of FIG. 6B as an etch mask.

Since the second lift-off layer 122 includes the fluoropolymer, a solvent capable of etching the fluoropolymer is used as an etching solution.

A first solvent (not shown) including fluorine may be used as the etching solution. The first solvent may include hydrofluoroether. Hydrofluoroether is electrochemically stable because of its low interaction with other materials and environmentally stable because of its low global warming potential and low toxicity.

During an etching process, a portion of the second lift-off layer 122 corresponding to the first portion 142-1, that is, formed over the second anode 102, is etched.

When the second lift-off layer 122 is etched, a second undercut profile UC2 is formed in the second lift-off layer 122 under a boundary surface of the first portion 142-1 of the second photoresist 142 due to the first solvent including the fluorine. A delicate deposition pattern of the second organic functional layer 152 may be formed in a deposition process due to the second undercut profile UC2.

During the etching process, a portion of the second lift-off layer 122 corresponding to the first portion 142-1, that is, formed over the second anode 102, is etched to expose an upper portion of the second anode 102.

After the etching process, the exposed second anode 102 is subjected to second plasma treatment PT2. A residue of the second lift-off layer 122 that may remain on the second anode 102 may be removed due to the second plasma treatment PT2.

Ultraviolet rays generated during the second plasma treatment PT2 may degrade the first organic functional layer 151 that is formed in the first unit process. However, in the present exemplary embodiment, the second barrier layer 132 formed on the first organic functional layer 151 may protect the first organic functional layer 151 by blocking ultraviolet rays while the second plasma treatment PT2 is performed.

Figure 6D:
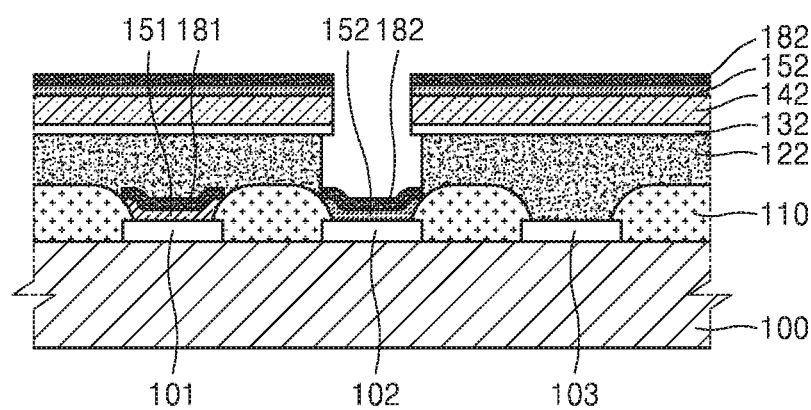

Referring to FIG. 6D, the second organic functional layer 152 including a second emission layer (not shown) and the second auxiliary cathode 182 are sequentially formed on the structure of FIG. 6C.

The second organic functional layer 152 may further include at least one functional layer from among a hole injection layer, a hole transport layer, an electron transport layer, and an electron injection layer.

The second organic functional layer 152 may be formed by using vapor deposition. In a deposition process, the second barrier layer 132, the second lift-off layer 122, and the second photoresist 142 function as a deposition mask. A part of the second organic functional layer 152 is formed at a position corresponding to the first portion 142-1, that is, over the second anode 102, and another part of the second organic functional layer 152 is formed on the second portion 142-2 of the second photoresist 142.

The second auxiliary cathode 182 may be formed by using vapor deposition, like the second organic functional layer 152. In a deposition process, the second barrier layer 132, the second lift-off layer 122, and the second photoresist 142 function as a deposition mask. A part of the second auxiliary cathode 182 is formed to cover a top surface of the second organic functional layer 152. Another part of the second auxiliary cathode 182 is formed on the second organic functional layer 152 to correspond to the second portion 142-2 other than the first portion 142-1 of the second photoresist 142.

The second auxiliary cathode 182 may include a material that is the same as that of the cathode 180 that is a common electrode. Alternatively, the second auxiliary cathode 182 may be formed of a material that is different from that of the cathode 180. The second auxiliary cathode 182 may function as a barrier for protecting the second organic functional layer 152 from a solvent used in a lift-off process.

Figure 6E:
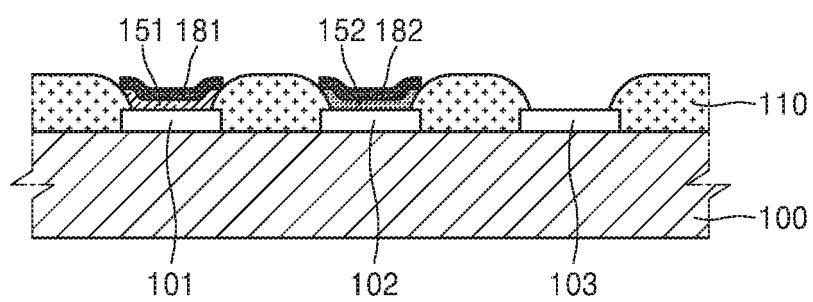

Referring to FIG. 6E, a lift-off process is performed on a structure of FIG. 6D.

Since the second lift-off layer 122 includes the fluoropolymer, a second solvent including fluorine is used in the lift-off process. Since the second organic functional layer 152 is formed and then the lift-off process is performed, the second solvent should have a low reactivity to the second organic functional layer 152. The second solvent may include hydrofluoroether, similar to the first solvent.

When the second lift-off layer 122 formed under the second portion 142-2 (see FIG. 6B) of the second photoresist 142 is lifted off, the second organic functional layer 152 and the second auxiliary cathode 182 formed on the second portion 142-2 (see FIG. 6B) of the second photoresist 142 are removed, and the second organic functional layer 152 and the second auxiliary cathode 182 formed on the second anode 102 remain as a pattern.

After the above-described second unit process is performed, a third unit process of forming the third organic functional layer 153 that emits color light different from that of the first organic functional layer 151 and the second organic functional layer 152 in an area where the third anode 103 is located is performed. The third unit process will now be explained with reference to FIGS. 7A through 7E.

Figure 7A:
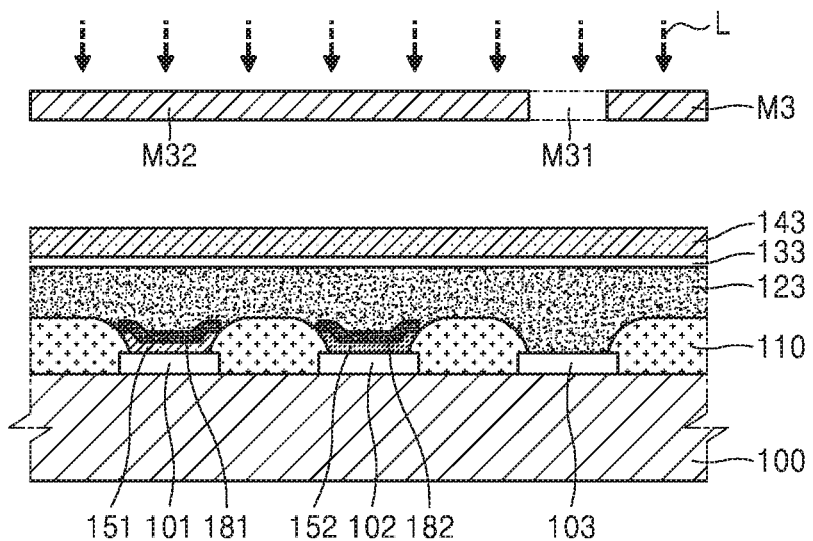
FIG. 7A, FIG. 7B, FIG. 7C, FIG. 7D, and FIG. 7E are cross-sectional views for explaining a third unit process of the manufacturing method of FIG. 1.

Referring to FIG. 7A, a third lift-off layer 123 including a fluoropolymer, a third barrier layer 133, and a third photoresist 143 are sequentially formed on a structure of FIG. 6E.

The fluoropolymer included in the third lift-off layer 123 may be a polymer having a fluorine content in a range of about 20 wt % to about 60 wt %. The third lift-off layer 123 may include a material that is the same as, or different from, that of the second lift-off layer 122. The third lift-off layer 123 may be formed by using coating, printing, or deposition.

The third barrier layer 133 is formed on the third lift-off layer 123. The third barrier layer 133 may prevent impurities from diffusing from the third photoresist 123 to the third lift-off layer 123. The third barrier layer 133 may include at least one from among a metal, metal oxide, metal nitride, metal oxynitride, and an alloy. Also, the third barrier layer 133 may include at least one from among silicon nitride, silicon oxide, and silicon oxynitride.

The third photoresist 143 is formed on the third barrier layer 133. A portion of the third photoresist 143 corresponding to the third anode 103 is exposed through a third photomask M3 including a region M31 through which light L is transmitted. Next, the exposed third photoresist 143 is developed.

Figure 7B:
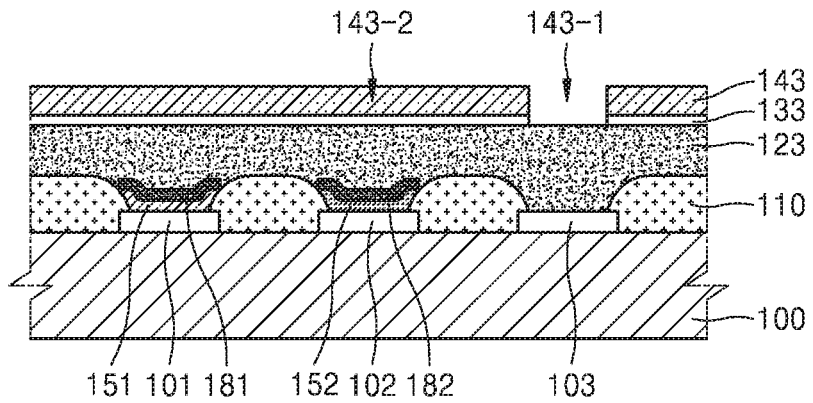

Referring to FIG. 7B, the third photoresist 143 is patterned. A first portion 143-1 of the third photoresist 143 corresponding to the third anode 103 and subjected to exposure and development is removed and a second portion 143-2 remains.

The third barrier layer 133 is patterned along with the third photoresist 143. The third barrier layer 133 is patterned by etching the third barrier layer 133 including an inorganic material by using a solution for developing the third photoresist 143. Since the third barrier layer 133 is etched by using a developing solution of the third photoresist 143, a process may be simplified.

PGMEA that is used as a solvent of the third photoresist 143 may diffuse to the third lift-off layer 123, and may degrade the first organic functional layer 151 and the second organic functional layer 152 that are formed in the first and second unit processes. Also, oxygen or moisture, as well as PGMEA, may diffuse to the third lift-off layer 123, and may degrade the first organic functional layer 151 and the second organic functional layer 152 that are formed in the first and second unit processes.

However, in the present exemplary embodiment, since the third barrier layer 133 is formed between the third lift-off layer 123 and the third photoresist 143, PGMEA, oxygen, or moisture may be prevented from diffusing to the third lift-off layer 123 while the third photoresist 143 is developed. Accordingly, degradation of the first organic functional layer 151 and the second organic functional layer 152 may be reduced or prevented.

Figure 7C:
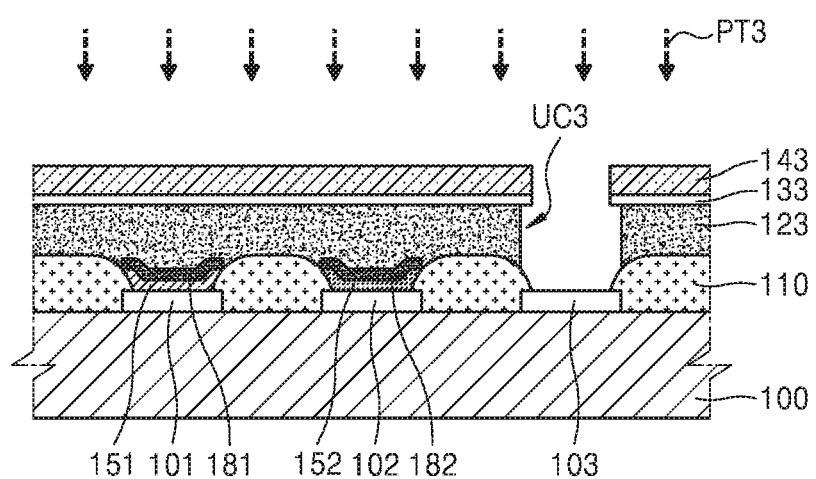

Referring to FIG. 7C, the third lift-off layer 123 is etched by using a pattern of the third barrier layer 133 and the third photoresist 143 of FIG. 7B as an etch mask.

Since the third lift-off layer 123 includes the fluoropolymer, a solvent capable for etching the fluoropolymer is used as an etching solution.

A first solvent (not shown) including fluorine may be used as the etching solution. The first solvent may include hydrofluoroether. Hydrofluoroether is electrochemically stable because of its low interaction with other materials and environmentally stable because of its low global warming potential and low toxicity.

During an etching process, a portion of the third lift-off layer 123 corresponding to the first portion 143-1, that is, formed over the third anode 103, is etched.

When the third lift-off layer 123 is etched, a third undercut profile UC3 is formed in the third lift-off layer 132 under a boundary surface of the first portion 143-1 of the third photoresist 143 due to the first solvent. A delicate deposition pattern of the third organic functional layer 153 may be formed in a deposition process due to the third undercut profile UC3.

During an etching process, a portion of the third lift-off layer 123 corresponding to the first portion 143-1, that is, formed over the third anode 103, is etched to expose an upper portion of the third anode 103.

After the etching process, the exposed third anode 103 is subjected to third plasma treatment PT3. A residue of the third lift-off layer 123 that may remain on the third anode 103 may be removed due to the third plasma treatment PT3.

Ultraviolet rays generated during the third plasma treatment PT3 may degrade the first organic functional layer 151 and the second organic functional layer 152 that are formed in the first and second unit processes. However, in the present exemplary embodiment, the third barrier layer 133 formed on the first organic functional layer 151 and the second organic functional layer 152 may protect the first organic functional layer 151 and the second organic functional layer 152 by blocking ultraviolet rays while the third plasma treatment PT3 is performed.

Figure 7D:
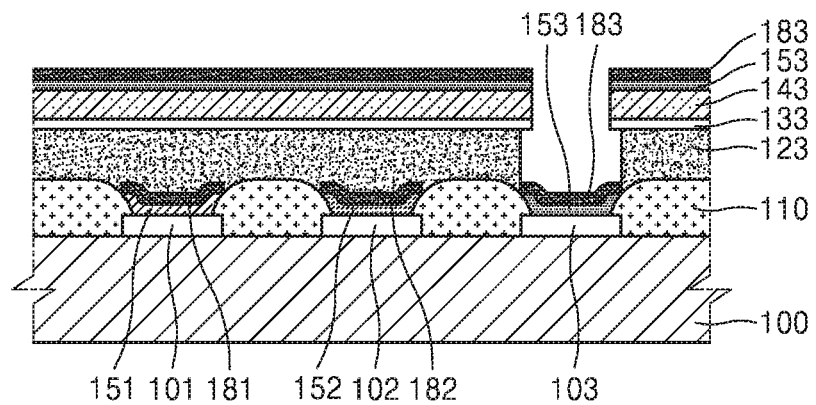

Referring to FIG. 7D, the third organic functional layer 153, including a third emission layer (not shown) and the third auxiliary cathode 183, are sequentially formed on the structure of FIG. 7C.

The third organic functional layer 153 may further include at least one functional layer from among a hole injection layer, a hole transport layer, an electron transport layer, and an electron injection layer.

The third organic functional layer 153 may be formed by using vapor deposition. In a deposition process, the third barrier layer 133, the third lift-off layer 123, and the third photoresist 143 function as a deposition mask. A part of the third organic functional layer 153 is formed at a position corresponding to the first portion 143-1, that is, over the third anode 103, and another part of the third organic functional layer 153 is formed on the second portion 143-2 of the third photoresist 143.

The third auxiliary cathode 183 may be formed by using vapor deposition, like the third organic functional layer 153. In a deposition process, the third barrier layer 133, the third lift-off layer 123, and the third photoresist 143 function as a deposition mask. A part of the third auxiliary cathode 183 is formed to cover a top surface of the third organic functional layer 153. Another part of the third auxiliary cathode 183 is formed on the third organic functional layer 153 to correspond to the second portion 143-2 other than the first portion 143-1 of the third photoresist 143.

The third auxiliary cathode 183 may include a material that is the same as that of the cathode 180 that is a common electrode. Alternatively, the third auxiliary cathode 183 may include a material that is different from that of the cathode 180. The third auxiliary cathode 183 may function as a barrier for protecting the third organic functional layer 153 from a solvent that is used in a lift-off process.

Figure 7E:
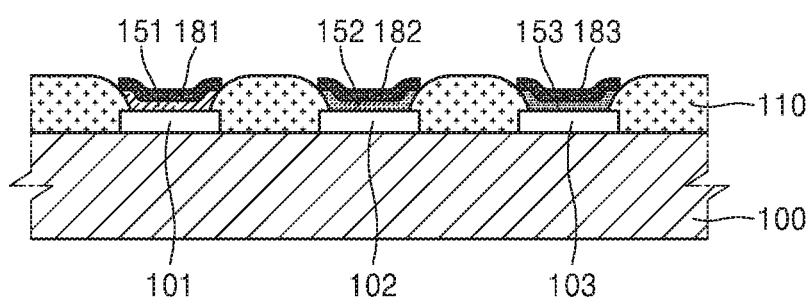

Referring to FIG. 7E, a lift-off process is performed on a structure of FIG. 7D.

Since the third barrier layer 133 and the third lift-off layer 123 include the fluoropolymer, a second solvent including fluorine is used in the lift-off process. Since the third organic functional layer 153 is formed and then the lift-off process is performed, the second solvent should have a low reactivity to the third organic functional layer 153. The second solvent may include hydrofluoroether, like the first solvent.

When the third lift-off layer 123 formed under the second portion 143-2 (see FIG. 7B) of the third photoresist 143 is lifted off, the third organic functional layer 153 and the third auxiliary cathode 183 formed on the second portion 143-2 (see FIG. 7B) of the third photoresist 143 are removed and the third organic functional layer 153 and the third auxiliary cathode 183 formed on the third anode 103 remain as a pattern.

After the above-described third unit process, the cathode 180 (see FIG. 2) that is a common layer is formed on the first through third auxiliary cathodes 181, 182, and 183. The first through third auxiliary cathodes 181, 182, and 183 may prevent a voltage drop of a cathode.

Although the first through third anodes 101, 102, and 103 are hole injection electrodes, and the first through third auxiliary cathodes 181, 182, and 183 are electron injection electrodes in the present exemplary embodiment, the inventive concepts are not limited thereto, and electron injection electrodes may be formed in an area where the first through third anodes 101, 102, and 103 are located, and hole injection electrodes may be formed in an area where the first through third auxiliary cathodes 181, 182, and 183 are located.

The first through third organic functional layers 151, 152, and 153 may emit light of different colors. Light emitted by the first through third organic functional layers 151, 152, and 153 may be mixed together to form white light. For example, the first through third organic functional layers 151, 152, and 153 may respectively emit red light, green light, and blue light. For example, the first through third organic functional layers 151, 152, and 153 may be elements of sub-pixels constituting a unit pixel of the organic light-emitting display apparatus 1.

The organic light-emitting display apparatus 1 of FIG. 2 may indicate one unit pixel. The present exemplary embodiment may be applied to an organic light-emitting display apparatus including a plurality of the unit pixels of FIG. 1. That is, a plurality of the first organic functional layers 151 that emit light of a first color may be simultaneously formed as a first group in a first unit process. A plurality of the second organic functional layers 152 that emit light of a second color may be simultaneously formed as a second group in a second unit process. A plurality of the third organic functional layers 153 that emit light of a third color may be simultaneously formed as a third group in a third unit process. A full-color image may be formed by using the first through third unit processes.

Although a barrier layer is formed in second and third unit processes and is not formed in a first unit process in the present exemplary embodiment, the inventive concepts are not limited thereto, and a barrier layer may also be formed in the first unit process. A process may be simplified by performing the first through third unit processes in the same manner.

A method of manufacturing an organic light-emitting display apparatus according to a comparative example of FIGS. 8A through 10E will now be explained for comparison.

FIGS. 8A through 8E are cross-sectional views for explaining a first unit process of an organic light-emitting display apparatus according to a comparative example. FIGS. 9A through 9E are cross-sectional views for explaining a second unit process of the organic light-emitting display apparatus according to the comparative example. FIGS. 10A through 10E are cross-sectional views for explaining a third unit process of the organic light-emitting display apparatus according to the comparative example.

Figure 8A:
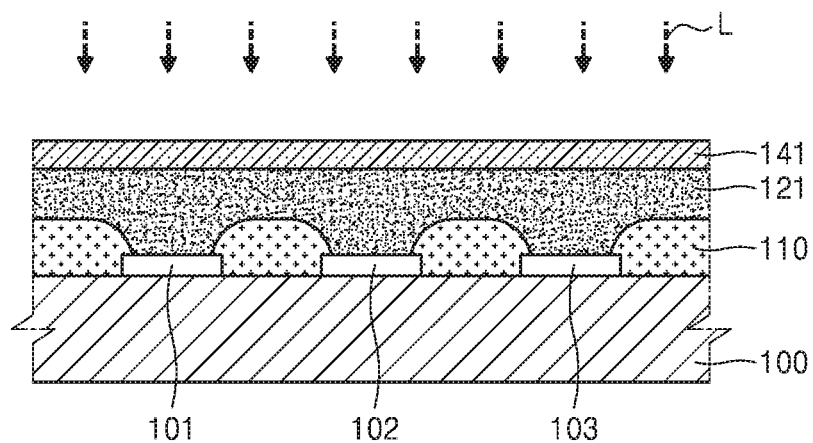
FIG. 8A, FIG. 8B, FIG. 8C, FIG. 8D, and FIG. 8E are cross-sectional views for explaining a first unit process of a manufacturing method according to a comparative example.

Referring to FIG. 8A, the first lift-off layer 121 including a fluoropolymer is formed on the substrate 100 on which the first through third anodes 101, 102, and 103 are formed, and the first photoresist 141 is formed on the first lift-off layer 121.

Figure 8B:
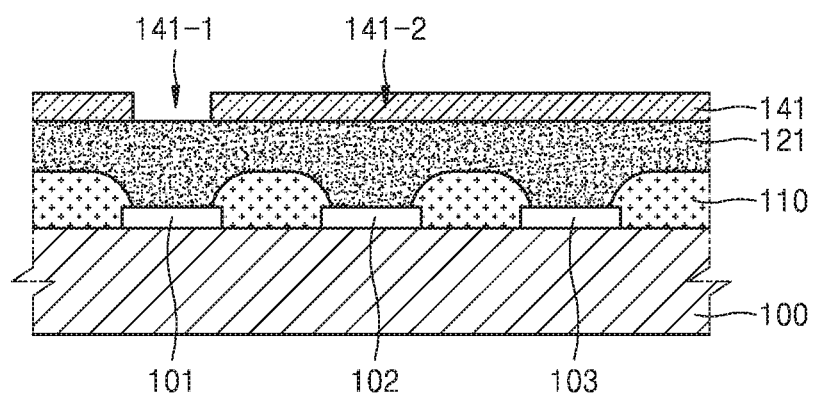

Referring to FIG. 8B, the first photoresist 141 is patterned. The first portion 141-1 of the first photoresist 141 corresponding to the first anode 101 and subjected to exposure and development is removed and the second portion 141-2 other than the first portion 141-1 remains.

Figure 8C:
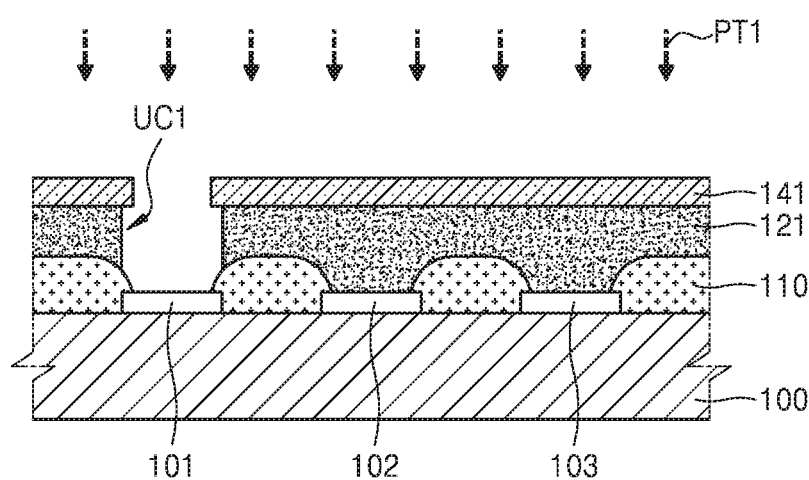

Referring to FIG. 8C, the first lift-off layer 121 is etched by using a first solvent (not shown) including fluorine by using a pattern of the first photoresist 141 of FIG. 7B as an etch mask. During an etching process, a portion of the first lift-off layer 121 corresponding to the first portion 141-1, that is, formed over the first anode 101, is etched. The first undercut profile UC1 is formed in the first lift-off layer 121 under a boundary surface of the first portion 141-1 of the first photoresist 141. After the etching process, the first plasma treatment PT1 is performed on the exposed first anode 101.

Figure 8D:
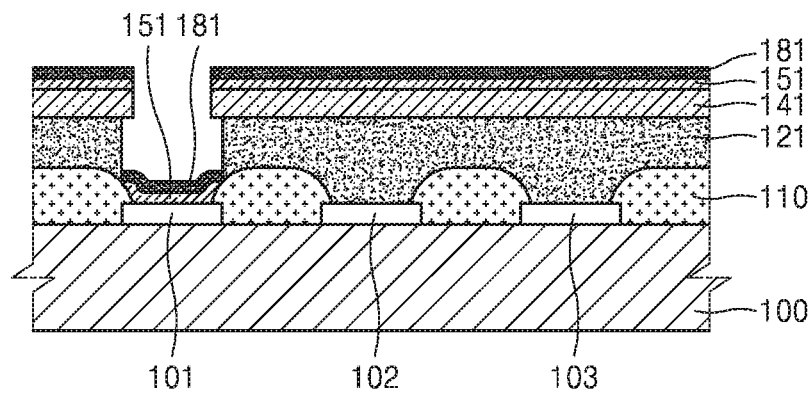

Referring to FIG. 8D, the first organic functional layer 151 and the first auxiliary cathode 181 are sequentially formed on a structure of FIG. 8C.

Figure 8E:
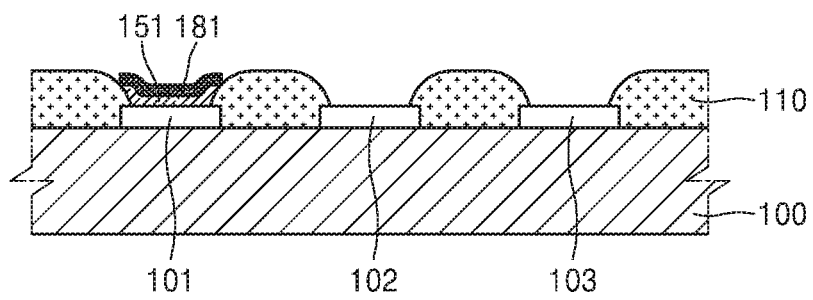

Referring to FIG. 8E, the first lift-off layer 121 that remains is completely removed by performing a first lift-off process, and thus the first organic functional layer 151 and the first auxiliary cathode 181 on the first anode 101 remain as a pattern.

After the above-described first unit process ends, a second unit process is performed in an area where the second anode 102 is located.

Figure 9A:
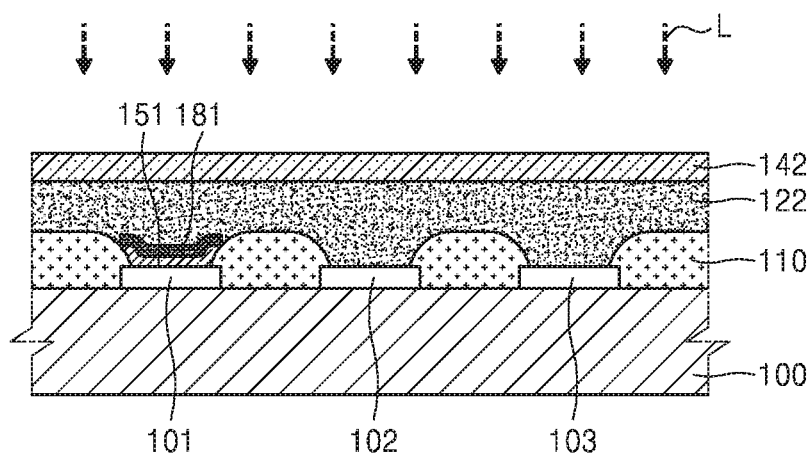
FIG. 9A, FIG. 9B, FIG. 9C, FIG. 9D, and FIG. 9E are cross-sectional views for explaining a second unit process of the manufacturing method according to the comparative example.

Referring to FIG. 9A, the second lift-off layer 122 and the second photoresist 142 are sequentially formed on the structure of FIG. 8E.

Figure 9B:
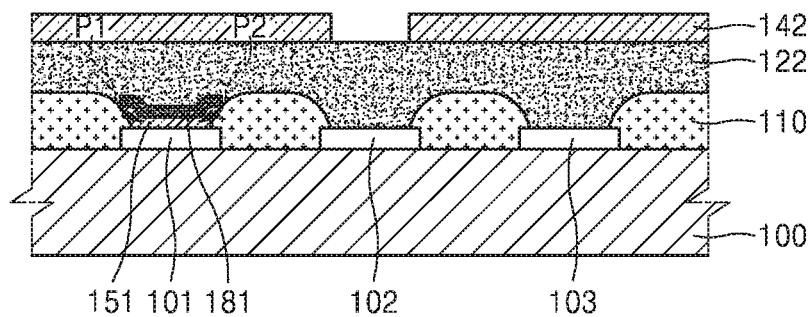

Referring to FIG. 9B, the second photoresist 142 is exposed and developed to remove the first portion 142-1 of the second photoresist 142 corresponding to the second anode 102 and to leave the second portion 142-2 other than the first portion 142-1.

The second lift-off layer 122 includes a fluoropolymer. Although the fluoropolymer is electrochemically stable because of its low interaction with other materials, PGMEA, moisture, or oxygen (e.g., P1 or P2) included in the second photoresist 142 may diffuse to the second lift-off layer 122 and may degrade the first organic functional layer 151.

Figure 9C:
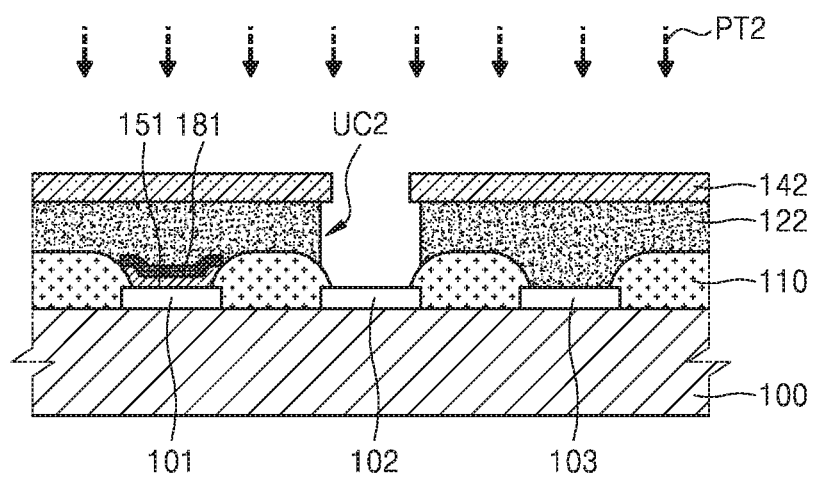

Referring to FIG. 9C, the second lift-off layer 122 is etched by using a first solvent (not shown) including fluorine by using a pattern of the second photoresist 142 of FIG. 9B as an etch mask. During an etching process, a portion of the second lift-off layer 122 corresponding to the first portion 142-1, that is, formed over the second anode 102, is etched. The second undercut profile UC2 is formed in the second lift-off layer 122 under a boundary surface of the first portion 142-1 of the second photoresist 142.

After the etching process, the second plasma treatment PT2 is performed on the exposed second anode 102 in order to remove a residue of the second lift-off layer 122. Ultraviolet rays that are generated during the second plasma treatment PT2 may degrade the first organic functional layer 151.

Figure 9D:
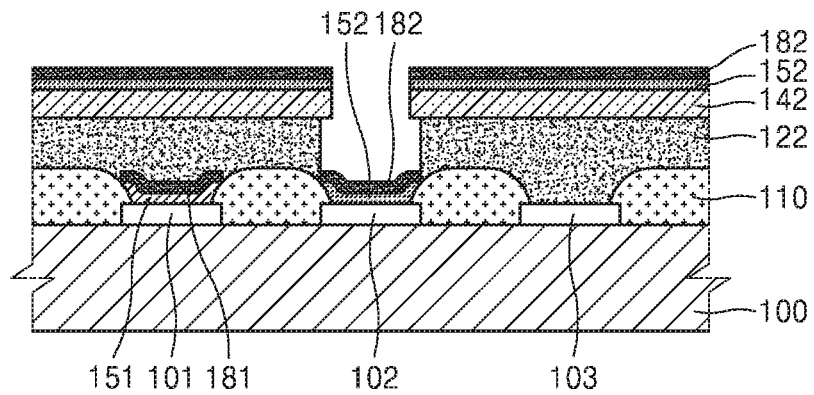

Referring to FIG. 9D, the second organic functional layer 152 and the second auxiliary cathode 182 are sequentially formed on a structure of FIG. 9C.

Figure 9E:
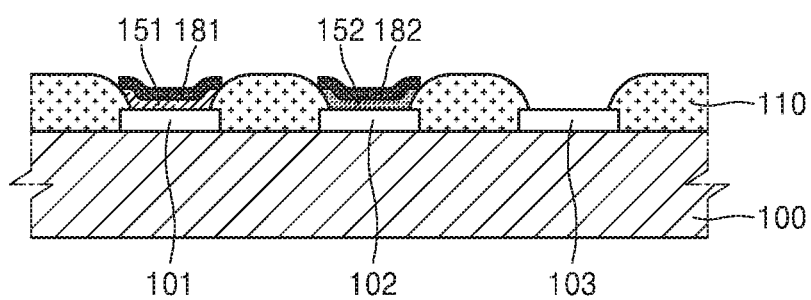

Referring to FIG. 9E, the second lift-off layer 122 that remains is completely removed by performing a second lift-off process, and thus, the first organic functional layer 151 and the first auxiliary cathode 181 on the first anode 101 and the second organic functional layer 152 and the second auxiliary cathode 182 on the second anode 102 remain as a pattern.

After the above-described second unit process ends, a third unit process is performed in an area where the third anode 103 is located.

Figure 10A:
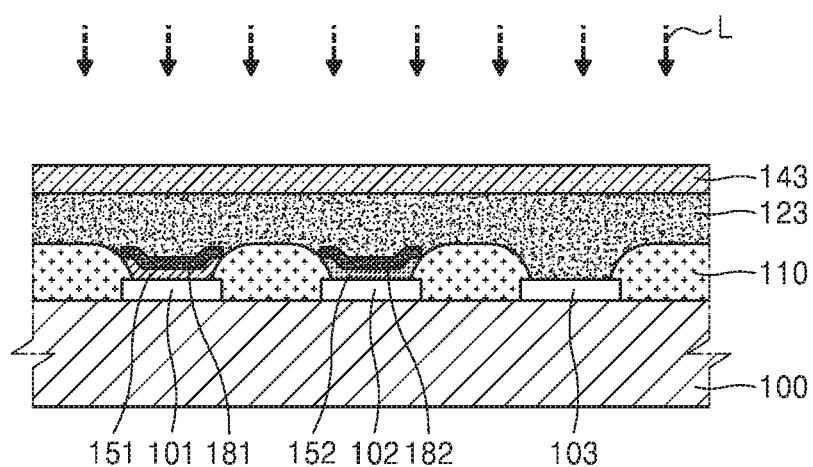
FIG. 10A, FIG. 10B, FIG. 10C, FIG. 10D, and FIG. 10E are cross-sectional views for explaining a third unit process of the manufacturing method according to the comparative example.

Referring to FIG. 10A, the third lift-off layer 123 and the third photoresist 143 are sequentially formed on the structure of FIG. 9E.

Figure 10B:
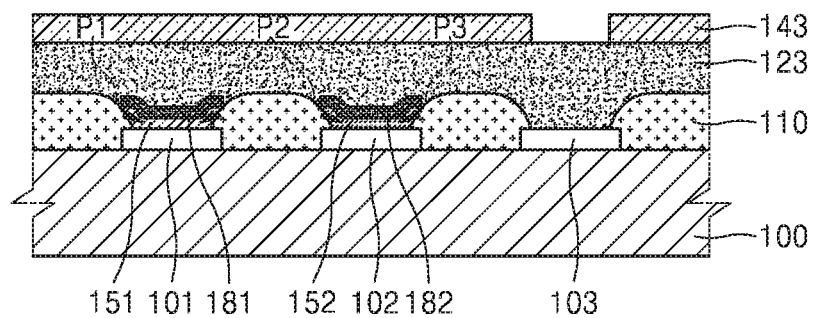

Referring to FIG. 10B, the third photoresist 143 is patterned, and the first portion 143-1 of the third photoresist 143 corresponding to the third anode 103 and subjected to exposure and development is removed and the second portion 143-2 other than the first portion 143-1 remains.

The third lift-off layer 123 includes a fluoropolymer. Although the fluoropolymer is electrochemically stable because of its low interaction with other materials, PGMEA, moisture, or oxygen (e.g., P1, P2, or P3) included in the third photoresist 143 may diffuse to the third lift-off layer 123 and may degrade the first organic functional layer 151 and the second organic functional layer 152.

Figure 10C:
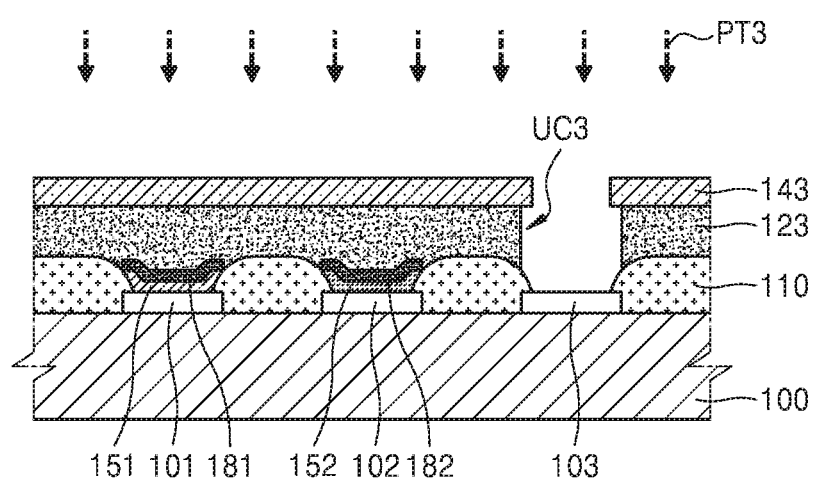

Referring to FIG. 10C, the third lift-off layer 123 is etched by using a first solvent (not shown) including fluorine by using a pattern of the third photoresist 143 of FIG. 10B as an etch mask. During an etching process, a portion of the third lift-off layer 123 corresponding to the first portion 143-1, that is, formed over the third anode 103, is etched. The third undercut profile UC3 is formed in the third lift-off layer 123 under a boundary surface of the first portion 143-1 of the third photoresist 143.

After the etching process, the third plasma treatment PT3 is performed on the exposed third anode 103 in order to remove a residue of the third lift-off layer 123. Ultraviolet rays that are generated during the third plasma treatment PT3 may degrade the first organic functional layer 151 and the second organic functional layer 152 that are formed in the first and second unit processes.

Figure 10D:
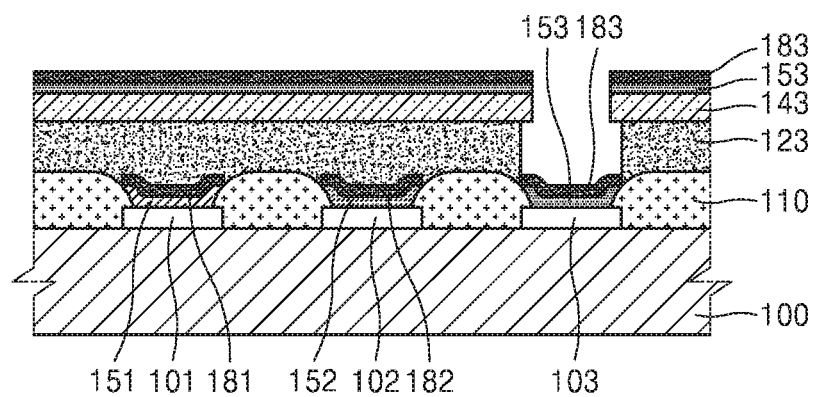

Referring to FIG. 10D, the third organic functional layer 153 and the third auxiliary cathode 183 are sequentially formed on a structure of FIG. 10C.

Figure 10E:
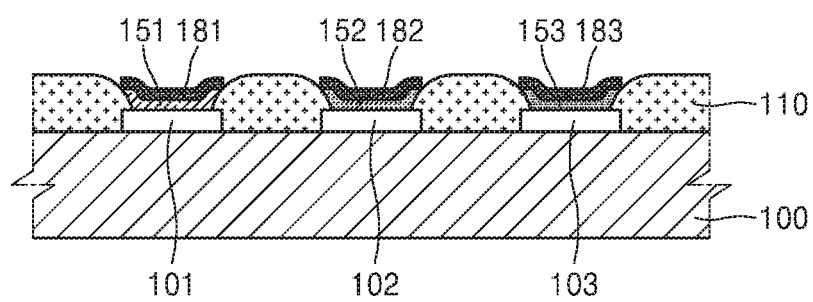

Referring to FIG. 10E, the third lift-off layer 123 that remains is completely removed by performing a third lift-off process, and thus the first organic functional layer 151 and the first auxiliary cathode 181 on the first anode 101, the second organic functional layer 152 and the second auxiliary cathode 182 on the second anode 102, and the third organic functional layer 153 and the third auxiliary cathode 183 on the third anode 103 remain as a pattern.

Although not shown in the drawings, the organic light-emitting display apparatuses may further include an encapsulation member for encapsulating an organic emission layer. The encapsulation member may include a glass substrate, a metal foil, and a thin-film encapsulation layer in which an inorganic layer and an organic layer are combined.

According to an exemplary embodiment, since an emission layer is formed without using a fine metal mask (FMM), a high-resolution display panel may be formed.

Also, since an organic emission layer may be prevented from being degraded by forming a barrier layer between a lift-off layer including a fluoropolymer and a photoresist, the number of defects may be reduced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing an organic light-emitting display apparatus, the method comprising:
   forming a lift-off layer on a substrate comprising a first electrode, the lift-off layer comprising a fluoropolymer;
   sequentially forming a barrier layer and a photoresist on the lift-off layer, the barrier layer comprising an inorganic material;
   patterning the photoresist and the barrier layer to remove a first portion of the photoresist corresponding to the first electrode such that a second portion other than the first portion remains;
   etching a portion of the lift-off layer corresponding to the first portion to expose the first electrode;
   forming an organic functional layer and an auxiliary electrode over the first electrode and the second portion of the photoresist, the organic functional layer comprising an emission layer; and
   removing the lift-off layer, the barrier layer, the photoresist, the organic functional layer, and the auxiliary electrode remaining on the second portion,
   wherein the barrier layer comprises at least one of a metal nitride and a metal oxynitride.

2. The method of claim 1, wherein a fluorine content of the lift-off layer is in a range of about 20 wt % to about 60 wt %.

3. The method of claim 1, wherein the organic functional layer further comprises at least one functional layer from among a hole injection layer, a hole transport layer, an electron transport layer, and an electron injection layer.

4. The method of claim 1, wherein the organic functional layer is formed by using a deposition process.

5. The method of claim 1, wherein the patterning of the photoresist and the barrier layer comprises removing parts of the photoresist and the barrier layer by using a photolithography process.

6. The method of claim 1, wherein the etching of the portion of the lift-off layer corresponding to the first portion comprises etching the portion of the lift-off layer corresponding to the first portion by using a first solvent comprising fluorine to expose the first electrode.

7. The method of claim 6, further comprising performing plasma treatment on the exposed first electrode.

8. The method of claim 1, wherein the removing of the lift-off layer, the barrier layer, the photoresist, the organic functional layer, and the auxiliary electrode remaining on the second portion comprises lifting off the lift-off layer remaining on the second portion by using a second solvent comprising fluorine to remove the barrier layer, the photoresist, the organic functional layer, and the auxiliary electrode along with the lift-off layer.

9. The method of claim 1, further comprising forming a pixel-defining film that surrounds an edge of the first electrode.

10. A method of manufacturing an organic light-emitting display apparatus, the method comprising:
    forming a lift-off layer on a substrate comprising a first electrode, the lift-off layer comprising a fluoropolymer;
    sequentially forming a barrier layer and a photoresist on the lift-off layer, the barrier layer comprising an inorganic material;
    patterning the photoresist and the barrier layer to remove a first portion of the photoresist corresponding to the first electrode such that a second portion other than the first portion remains;
    etching a portion of the lift-off layer corresponding to the first portion to expose the first electrode;
    forming an organic functional layer and an auxiliary electrode over the first electrode and the second portion of the photoresist, the organic functional layer comprising an emission layer; and
    removing the lift-off layer, the barrier layer, the photoresist, the organic functional layer, and the auxiliary electrode remaining on the second portion,
    wherein the barrier layer comprises silicon oxynitride.

* * * * *